(12) United States Patent
Erlandson et al.

(10) Patent No.: US 7,290,117 B2
(45) Date of Patent: Oct. 30, 2007

(54) MEMORY HAVING INCREASED DATA-TRANSFER SPEED AND RELATED SYSTEMS AND METHODS

(75) Inventors: Erik E. Erlandson, Roseville, CA (US); David A. Tremblay, Jr., Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 272 days.

(21) Appl. No.: 10/032,109

(22) Filed: Dec. 20, 2001

(65) Prior Publication Data

US 2003/0120893 A1 Jun. 26, 2003

(51) Int. Cl.
G06F 12/00 (2006.01)
G06F 8/00 (2006.01)

(52) U.S. Cl. ............... 711/217; 711/218; 711/219; 365/189.07; 365/230.02; 365/230.08

(58) Field of Classification Search ............... 711/2, 711/211, 200, 212, 217, 218, 219, 220
See application file for complete search history.

(56) References Cited

U.S. PATENT DOCUMENTS

| | | | | |
|---|---|---|---|---|
| 5,442,588 | A * | 8/1995 | Runas | 365/222 |
| 5,570,320 | A | 10/1996 | Runas | |
| 5,610,873 | A * | 3/1997 | Lee | 365/230.01 |
| 5,946,247 | A * | 8/1999 | Osawa et al. | 365/201 |
| 5,966,724 | A * | 10/1999 | Ryan | 711/105 |
| 6,094,373 | A * | 7/2000 | Saito | 365/185.22 |
| 6,108,243 | A | 8/2000 | Suzuki et al. | |
| 6,122,718 | A * | 9/2000 | Ito | 711/219 |
| 6,128,716 | A * | 10/2000 | Biggs | 711/169 |
| 6,263,490 | B1 * | 7/2001 | Tanaka | 717/125 |
| 6,327,180 | B2 * | 12/2001 | Taura et al. | 365/185.09 |
| 6,327,210 | B1 * | 12/2001 | Kuroda et al. | 365/222 |
| 6,430,100 | B2 * | 8/2002 | Kim | 365/225.7 |
| 6,484,231 | B1 * | 11/2002 | Kim | 711/105 |
| 6,563,759 | B2 * | 5/2003 | Yahata et al. | 365/233 |
| 2001/0028278 | A1 * | 10/2001 | Ooishi | 331/57 |
| 2002/0023193 | A1 * | 2/2002 | Nakamura | 711/106 |
| 2002/0110037 | A1 * | 8/2002 | Fukuyama | 365/230.03 |

OTHER PUBLICATIONS

European Search Report dated Dec. 12, 2003.

* cited by examiner

Primary Examiner—Jasmine Song

(57) ABSTRACT

A memory includes an address bus, address counter, address decoder, comparator, and control circuit. During a data read or write cycle, the address bus receives an external address, the address counter generates an internal address, which the address decoder decodes, and the comparator compares the external address to a value. Based on the relationship between the external address and the value, the comparator enables or disables the data transfer. For example, such a memory can terminate a page-mode read/write cycle by determining when the current external column address is no longer equal to the current internal column address. This allows the system to terminate the cycle after a predetermined number of data transfers by setting the external column address to a value that does not equal the internal column address. Or, the comparator can compare the external or internal address to a predetermined end address, and the memory can terminate the cycle when the external or internal address equals the end address.

35 Claims, 6 Drawing Sheets

MEMORY HAVING INCREASED DATA-TRANSFER SPEED AND RELATED SYSTEMS AND METHODS

BACKGROUND OF THE INVENTION

1. Field of the Invention

The invention relates generally to semiconductor circuits, and more particularly to a memory that allows faster data transfers than similar conventional memories, to systems that incorporate the memory, and to related data-transfer methods. In one embodiment, the memory generates an internal column address and receives an external column address during a page-mode data-transfer (read/write) cycle. By coupling the internal address to the column decoder instead of the external address, the memory can achieve a faster data-transfer speed. And by monitoring the external address, the memory allows the system to access a page of any length.

2. Description of the Background Art

The operating speeds of processor peripherals such as memory circuits often prevent engineers from designing faster digital-electronic systems. The speeds of microprocessors, which are at the hearts of today's digital systems, have increased dramatically within the last few years. But the speeds of today's memory circuits and other processor peripherals have lagged behind. Therefore, these slower peripherals typically limit the overall speed of a digital system because the system microprocessor must effectively "slow down" during transfers of data to and from these peripherals. That is, these slower peripherals are the "weak link in the chain".

FIG. 1 is a timing diagram of a conventional fast-page-mode read cycle, which increases a memory's (memory not shown in FIG. 1) data-transfer speed by allowing a system (not shown in FIG. 1) to read multiple columns within a row, i.e., "page," without reasserting the row address between reads. At time $t_0$, the system asserts an active-low Row Address Strobe ($\overline{RAS}$) to latch the row address that the system has driven onto an external address bus. At time $t_1$, the system drives the first column address onto the external address bus, and, at time $t_2$, the system asserts an active-low Column Address Strobe ($\overline{CAS}$) to latch the first column address. At time $t_3$, the data stored in the addressed memory location (not shown in FIG. 1) appears on the data bus. The system repeats these steps for subsequent column addresses until it reads data from all the desired memory locations within the addressed row. To exit the fast-page mode, the system transitions ($\overline{RAS}$) to an inactive high level (transition not shown in FIG. 1).

Unfortunately, latching an external column address for each data transfer limits the minimum fast-page-mode cycle time $t_{pc}$, which is the minimum period of $\overline{CAS}$ that the memory manufacturer specifies for proper operation of the memory in fast-page mode. Each column address requires a minimum time $t_s$—sometimes called the setup or precharge time—to propagate from the external address bus, through the memory's front-end circuitry (not shown in FIG. 1), to the column-address decoder (not shown in FIG. 1), where the system latches the column address by asserting $\overline{CAS}$. Therefore, to prevent data-transfer errors, $t_{pc}$ must be long enough to account for $t_s$. If, however, $t_{pc}$ is not long enough to account for $t_s$, then the column-address decoder may latch an erroneous column address when the system asserts $\overline{CAS}$; consequently, the system may end up reading data from the wrong memory location.

FIG. 2 is a timing diagram of a conventional nibble-mode read cycle, which allows faster data transfers than the fast-page-mode read cycle (FIG. 1) does because the memory (not shown in FIG. 2) generates the column addresses internally. As in the fast-page mode, the system (not shown in FIG. 2) asserts $\overline{RAS}$ at time $t_0$ to latch the row address. At time $t_1$, the system drives a first column base address onto the external address bus, and, at time $t_2$, the system asserts $\overline{CAS}$ to latch this base address. An adder (not shown in FIG. 2) inside the memory sums a nibble count (here 00) with the base address to generate an initial column address, and, at time $t_3$, the data stored at the generated column address appears on the data bus. Next, a nibble counter (not shown in FIG. 2) inside of the memory increments the nibble count, and the adder sums the incremented nibble count (here 01) with the base address to generate a first subsequent column address (not shown in FIG. 2). At time $t_4$, the system asserts $\overline{CAS}$ to latch this subsequent column address into the address decoder (not shown in FIG. 2), and at time $t_5$, the data stored in the addressed memory location appears on the data bus. The system continues asserting $\overline{CAS}$ until it has accessed a predetermined number—sometimes called a "nibble"—of columns (here four columns) within the row. To address a second nibble of columns within the same row, the system drives a second column base address (not shown in FIG. 2) onto the address bus and clocks $\overline{CAS}$ to repeat the cycle. Because the memory generates the subsequent column addresses internally, the minimum nibble-mode cycle time $t_{nc}$ (for all $\overline{CAS}$ cycles except the initial cycle) need not account for the external-address setup time $t_s$ (FIG. 1); consequently, $t_{nc}$ is typically shorter than the minimum fast-page-mode cycle time $t_{pc}$. In one example, $t_{pc}$ is 60 nanoseconds (ns), and $t_{nc}$ for the same memory is 40 ns. Thus, the system can read data from the memory faster during the nibble mode than it can during the fast-page mode.

Unfortunately, because the number of columns in a nibble is typically fixed, reading data from more than one nibble of columns within a row often slows the data transfer by requiring the system to drive an additional column index address onto the external address bus for each additional nibble to be read. The nibble counter within the memory (neither shown in FIG. 2) typically has a fixed length (here two bits), therefore, if the system wants to read more than one nibble's worth (four columns here) of data from a row, it must execute multiple nibble-mode cycles. As stated above, the system must drive a column index address onto the external address bus at the beginning of each nibble-mode cycle. Because the column index address is on the external address bus, a setup time approximately equal to $t_s$ is required for the index address to propagate from the external address bus, through the memory's front-end circuitry, to the nibble adder (not shown in FIG. 1), and for the generated column address to propagate from the adder to the column-address decoder. Thus, the minimum nibble-mode cycle time for the first cycle is significantly longer than $t_{nc}$, and may be as long or longer than the minimum page-mode cycle time $t_{pc}$.

Furthermore, because a memory often does not allow the system to read a partial nibble, the number of columns the system reads often must be divisible by the number of columns in a nibble. For example, if there are four columns in a nibble, the number of columns the system can access during a nibble-mode cycle must be a multiple of four, i.e., 4, 8, 12, 16, . . .

Although fast-page- and nibble-mode read cycles are discussed above in conjunction with FIGS. 1 and 2, fast-page- and nibble-mode write cycles have similar problems.

SUMMARY OF THE INVENTION

In one aspect of the invention, a memory includes an address bus, address counter, address decoder, comparator, and control circuit. During a data read or write cycle, the address bus receives an external address and the address counter generates an internal address. The address decoder decodes the internal address, and the comparator compares the external address to a value. Based on the relationship between the external address and the value, the comparator enables or disables the data transfer.

For example, such a memory can terminate a page-mode cycle by determining when the current external column address is no longer equal to the current internal column address. This allows the system to terminate the cycle after any number of data transfers by setting the external column address to a value that does not equal the internal column address. Or, the memory can terminate the cycle by comparing the external address to a predetermined stop address.

In a related aspect of the invention, the control circuit enables or disables the data transfer based on a relationship between the internal address and a programmable value.

For example, the memory can terminate a page-mode cycle by comparing the internal column address to a programmable stop value, or by decrementing a programmable count value until the count reaches a predetermined stop value such as zero.

Consequently, such a memory combines the higher data-transfer speed of a conventional nibble mode with the greater page-length flexibility of a conventional fast-page mode.

DESCRIPTION OF THE PREFERRED EMBODIMENTS

The following discussion is presented to enable one skilled in the art to make and use the invention. Various modifications to the disclosed embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 2:
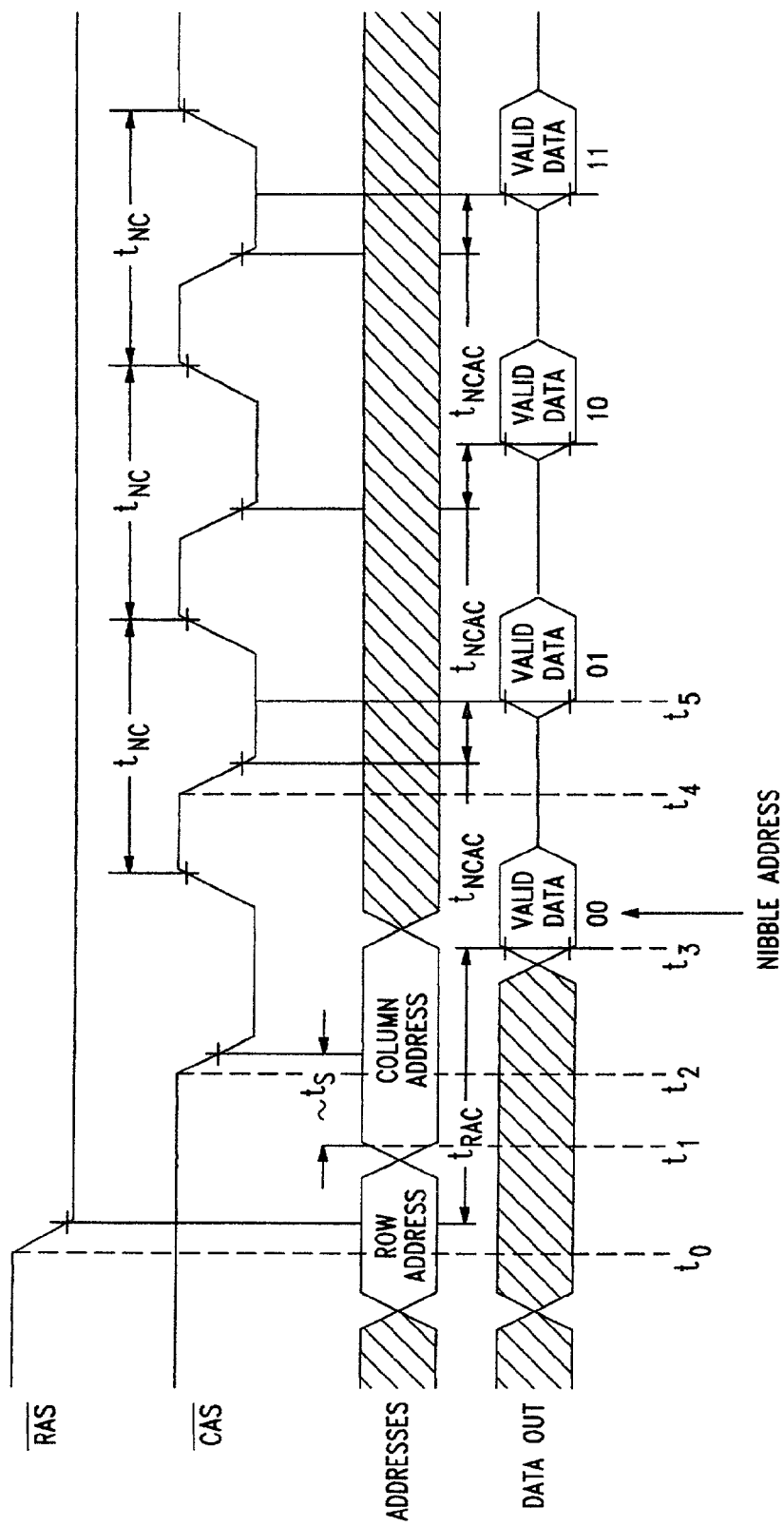
FIG. 2 is a timing diagram of a conventional nibble-mode read cycle.
Figure 3:
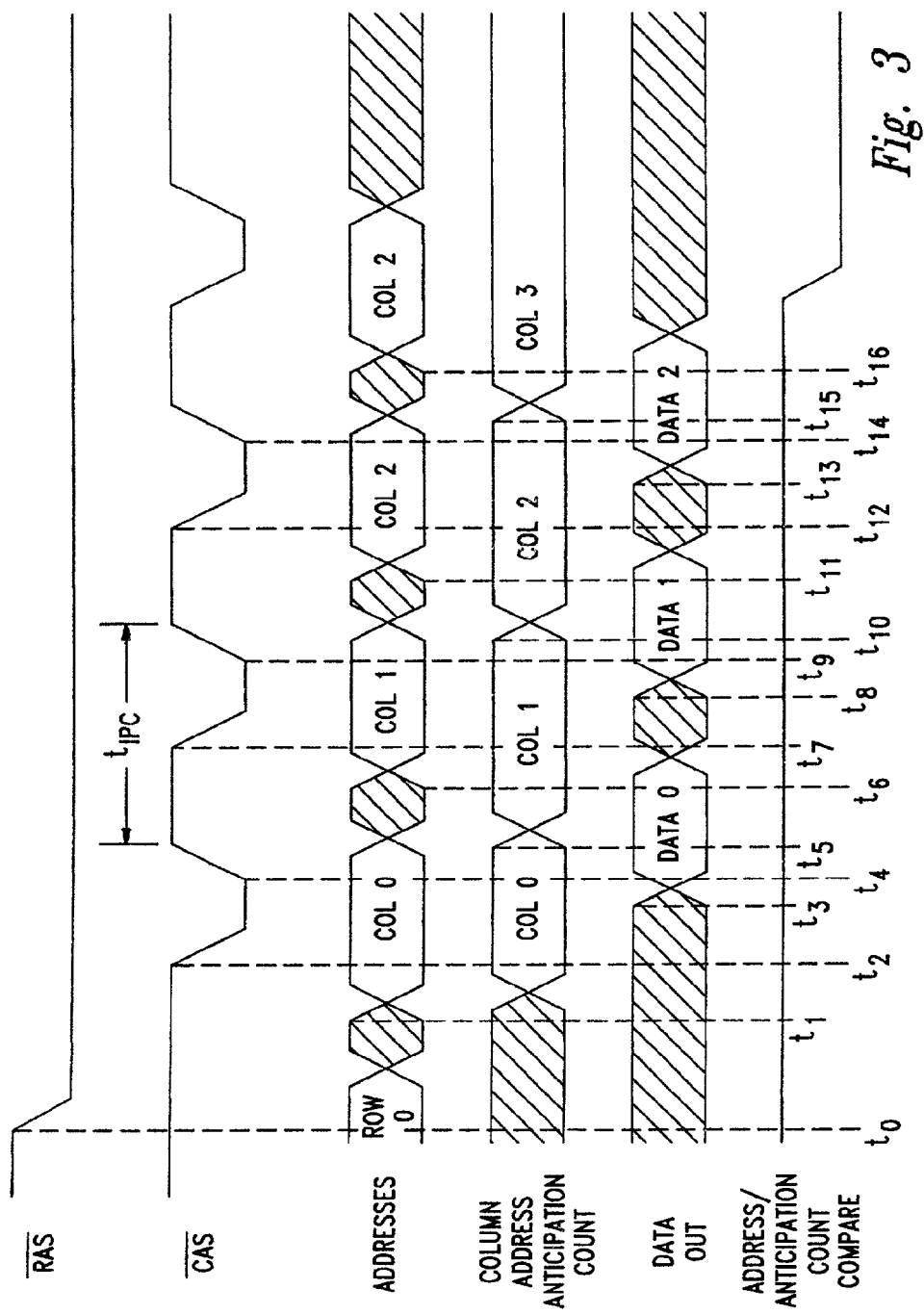
FIG. 3 is a timing diagram of a page-mode read cycle according to an embodiment of the invention.

FIG. 3 is a timing diagram of a page-mode read cycle according to an embodiment of the invention. During this cycle, a memory (FIG. 5) generates an internal column address to increase the data-transfer speed as it would if executing the nibble-mode read cycle of FIG. 2. But in addition, the memory receives an external column address, and, as discussed below in conjunction with FIGS. 3 and 4 monitors the external column address to determine when to terminate the cycle. Therefore, unlike the nibble-mode read cycle, the improved page-mode read cycle allows the memory to latch only one column address regardless of the length of the page, i.e., the number of columns addressed within the addressed row. Consequently, the improved page-mode cycle time $t_{ipc}$ is often shorter than the cycle time $t_{pc}$ (FIG. 1), and, in one embodiment, is the same or approximately the same as the nibble-mode cycle time $t_{nc}$ (FIG. 2).

Figure 4:
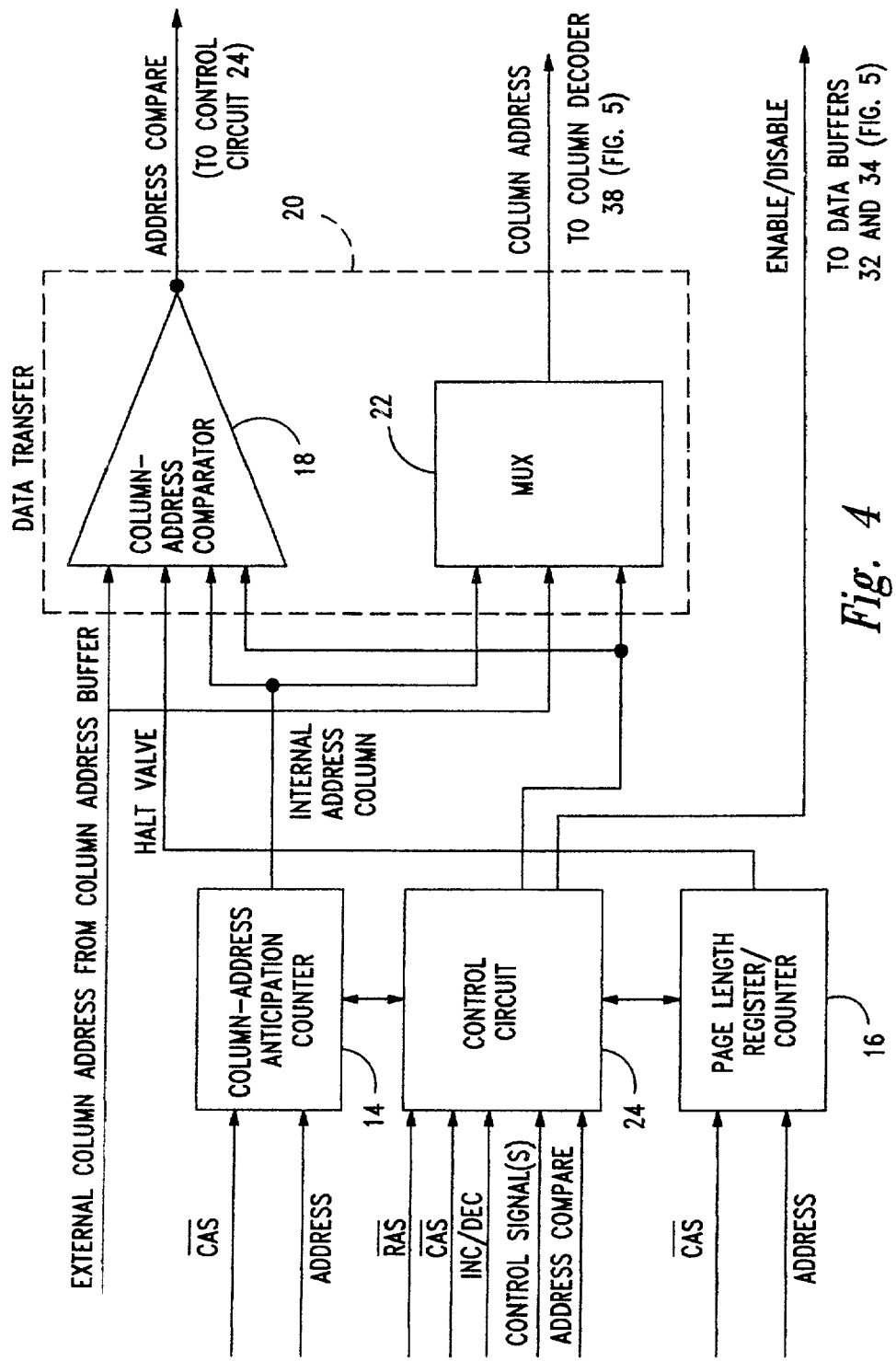
FIG. 4 is a schematic block diagram of a page-mode circuit that can execute the page-mode read cycle of FIG. 3 according to an embodiment of the invention.

FIG. 4 is a schematic block diagram of a page-mode circuit 12 that allows a memory (FIG. 5) to execute the page-mode cycle of FIG. 3 according to an embodiment of the invention. The circuit 12 includes a column-address-anticipation counter 14 that receives an initial column address or base address from the external address bus and increments, decrements, or otherwise varies this initial address to generate an internal column address in response to the rising edge of $\overline{CAS}$. An optional page-length register/counter 16 stores and/or generates a page-stop value, and a comparator 18 of a mux/comparator circuit 20 generates a comparison signal having a value that is based on a comparison of two of the following values: the external column address, internal column address, and the page-stop value. A multiplexer 22 of the mux/comparator circuit 20 couples the internal column address to the column decoder (FIG. 5) during the page-mode cycle, and may couple the external column address to the column decoder in other data-transfer modes. A control circuit 24 controls the counter 14, register/counter 16, and the mux/comparator circuit 20 in response to the comparison signal from the comparator 18 and from signals received from the system (FIG. 6). For example, the control circuit 24 can configure the column address counter 14, the register/counter 16, or both to increment or decrement based on the value of an Increment/Decrement signal from the system. Also, the control circuit 24 can generate a data-transfer enable/disable signal to enable the data buffers and/or the counter 14 (FIG. 5) during a page-mode cycle and to disable the data buffers and/or the counter 14 when the system terminates the cycle.

Figure 5:
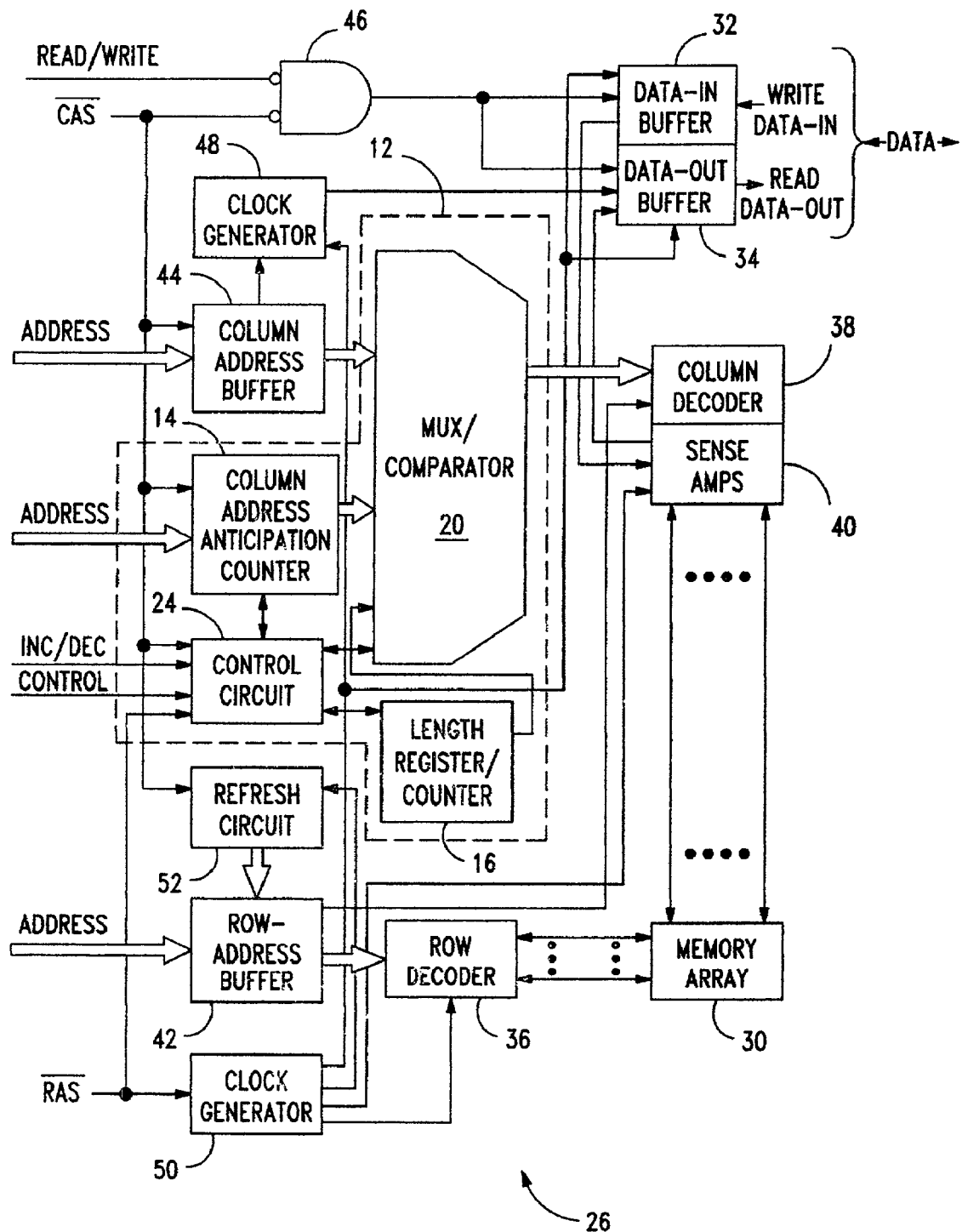
FIG. 5 is a schematic block diagram of a memory circuit that includes the page-mode circuit of FIG. 4 according to an embodiment of the invention.
Figure 6:
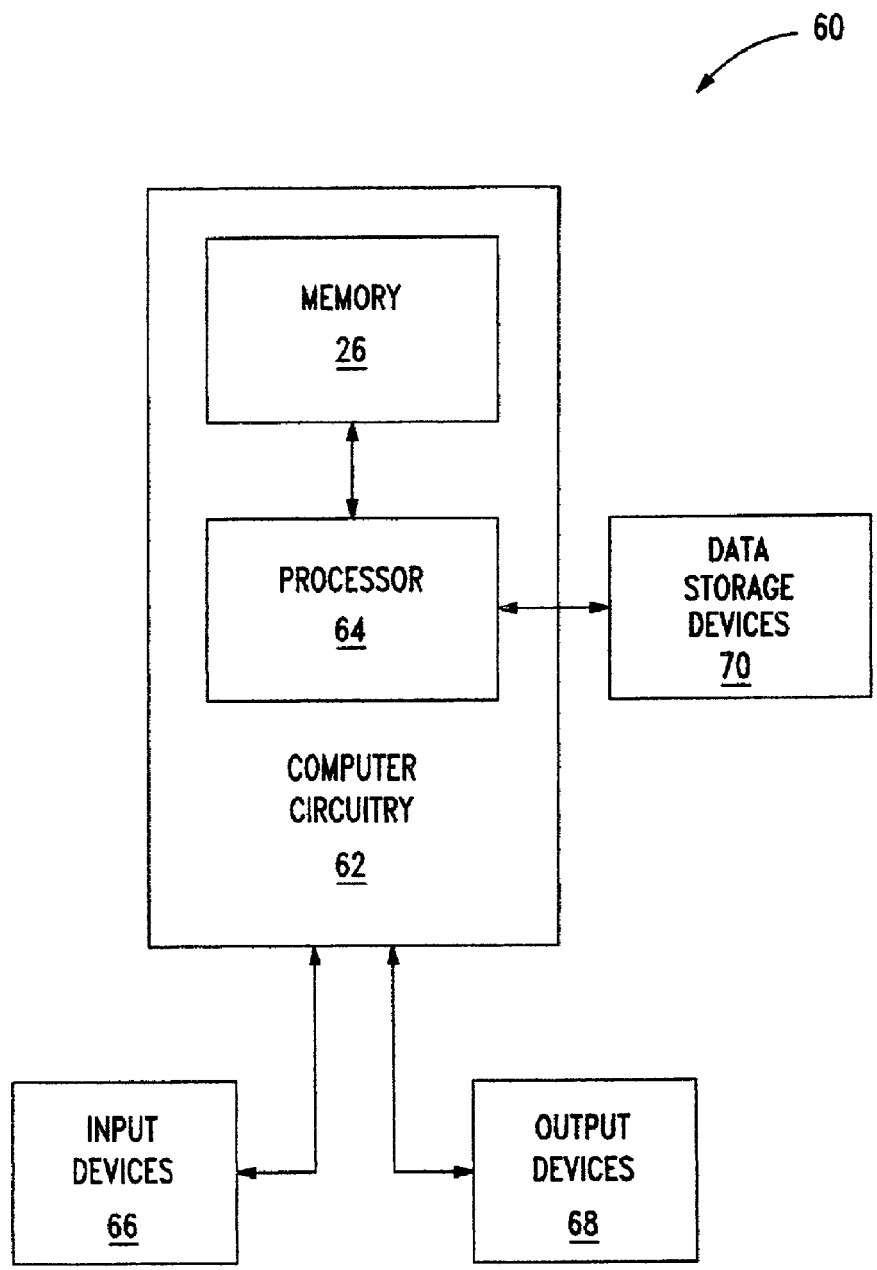
FIG. 6 is a schematic block diagram of a digital computer system that includes the memory circuit of FIG. 5 according to an embodiment of the invention.

FIG. 5 is a block diagram of a memory circuit 26, which includes the page-mode circuit 12 of FIG. 4 according to an embodiment of the invention. In the disclosed embodiment, the memory 26 is a Dynamic Random Access Memory (DRAM), although the memory 26 may be another type of memory such as a Static Random Access Memory (SRAM). Furthermore, other than the circuit 12, the other blocks of the memory 26 are conventional, and, therefore, are not discussed in detail.

In addition to the page-mode circuit 12, the memory circuit 26 includes a memory array 30 for storing data, a data-in buffer 32 for receiving write data that the system (FIG. 6) drives onto the data bus during a write cycle, and a data-out buffer 34 for driving read data from the array 30 onto the data bus during a read cycle such as the page-mode read cycle of FIG. 3. A row decoder 36 activates the addressed row of the memory array 30 to be written to or read from, and a column decoder 38 couples the addressed column or columns to the buffer 32 (write cycle) or the buffer 34 (read cycle) via sense amplifiers 40. A row-address buffer 42 stores the row address that the system drives onto the address bus and provides it to the row decoder 36. Likewise, a column-address buffer 44 stores the column address that the system drives onto the address bus and provides it to the column decoder 38 via the multiplexer 22 (FIG. 4) of the mux/comparator circuit 20. A logic gate such as a NAND gate 46 enables/disables the data-in and data-out buffers 32 and 34 in response to the system read/write and $\overline{CAS}$ signals. Clock generators 48 and 50 generate respective clock signals for the circuit blocks of the memory 26, and a refresh circuit 52 periodically refreshes the data stored in the memory array 30.

Referring to FIGS. 3-5, the operation of the memory circuit 26 during the page-mode read cycle of FIG. 3 is discussed according to an embodiment of the invention.

At time $t_0$, the system (FIG. 6) asserts $\overline{RAS}$ to latch the row address, ROW 0, in the row-address buffer 42. Also, by asserting the appropriate value for Inc/Dec, the system instructs the control circuit 24 to configure the column-address anticipation counter 14 to operate in increment mode.

At time $t_1$, the system drives the initial column address COL 0 onto the address bus, and in response, the column-address counter 14 stores COL 0.

At time $t_2$, the system asserts $\overline{CAS}$ to latch the address COL 0 in the counter 14. COL 0 propagates to the column decoder 38, which causes the sense amplifiers 40 to load the data, DATA 0, stored at ROW 0, COL 0 of the memory array 30 into the data-out buffer 34.

At time $t_3$, the clock generator 48 clocks DATA 0 from the data-out buffer 34 onto the data bus.

At time $t_4$, the system transitions $\overline{CAS}$ to an inactive level, and, in response to this transition, the counter 14 increments the internal column address to COL 1 at time $t_5$. COL 1 is the column address that the counter 14 "anticipates" to be the next external column address that the system will drive onto the address bus.

At time $t_6$, the system drives the external column address COL 1 onto the address bus. The comparator 18, under the control of the control circuit 24, compares the external column address on the address bus to the internal column address in the counter 14. Because these addresses are equal, the control circuit 24 determines that the page-mode read cycle is still active. Also, the internal column address COL 1 propagates from the counter 14, through the multiplexer 22, to the column decoder 38. Because COL 1 is internally generated, the setup time—the time required for COL 1 to propagate from the counter 14 to the column decoder 38—is shorter than it would be for the external generated COL 1. Furthermore, the counter 14 generates internal COL 1 before the system drives external COL 1 onto the address bus. Therefore, the combination of these two factors allows the internal COL 1 to arrives at the column decoder 38 sooner than the external COL 1. Consequently, for the same memory circuit, the page-mode cycle time $t_{ipc}$ is typically much shorter than $t_{pc}$ of the convention fast-page mode of FIG. 1, on the order of $t_{nc}$ of FIG. 2.

At time $t_7$, the system asserts $\overline{CAS}$, and the column decoder 38 causes the sense amplifiers 40 to load the data, DATA 1, stored at ROW 0, COL 1 of the memory array 30 into the data-out buffer 34.

At time $t_8$, the clock generator 48 clocks DATA 1 from the data-out buffer 34 onto the data bus.

At time $t_9$, the system transitions $\overline{CAS}$ to an inactive level, and, in response to this transition, the counter 14 increments the internal column address to COL 2 at time $t_{10}$. COL 2 is the column address that the counter 14 anticipates to be the next external column address that the system will drive onto the address bus.

At time $t_{11}$, the system drives the column address COL 2 onto the address bus. The comparator 18, under the control of the control circuit 24, compares the external column address on the address bus to the internal column address in the counter 14. Because these addresses are equal, the control circuit 24 determines that the page-mode read cycle is still active. Also, the internal column address COL 2 propagates from the counter 14, through the multiplexer 22, to the column decoder 38.

At time $t_{12}$, the system asserts $\overline{CAS}$, and the column decoder 38 causes the sense amplifiers 40 to load the data, DATA 2, stored at ROW 0, COL 2 of the memory array 30 into the data-out buffer 34.

At time $t_{13}$, the clock generator 48 clocks DATA 2 from the data-out buffer 34 onto the data bus.

At time $t_{14}$, the system transitions $\overline{CAS}$ to an inactive level, and, in response to this transition, the counter 14 increments the column address to COL 3 at time $t_{15}$. COL 3 is the address that the counter 14 anticipates to be the next external column address that the system will drive onto the address bus.

At time $t_{16}$, the system drives the external column address COL 2, or any value other than COL 3, onto the address bus to signal the end of the page-mode read cycle. The comparator 18 compares the value on the address bus to the internal column address in the counter 14. Because the value and address are unequal, the control circuit 24 determines that the system has terminated the page-mode read cycle. Therefore, the control circuit 24 disables the data-out buffer 34, the counter 14, or both, and the memory 26 awaits the next system command.

Figure 1:
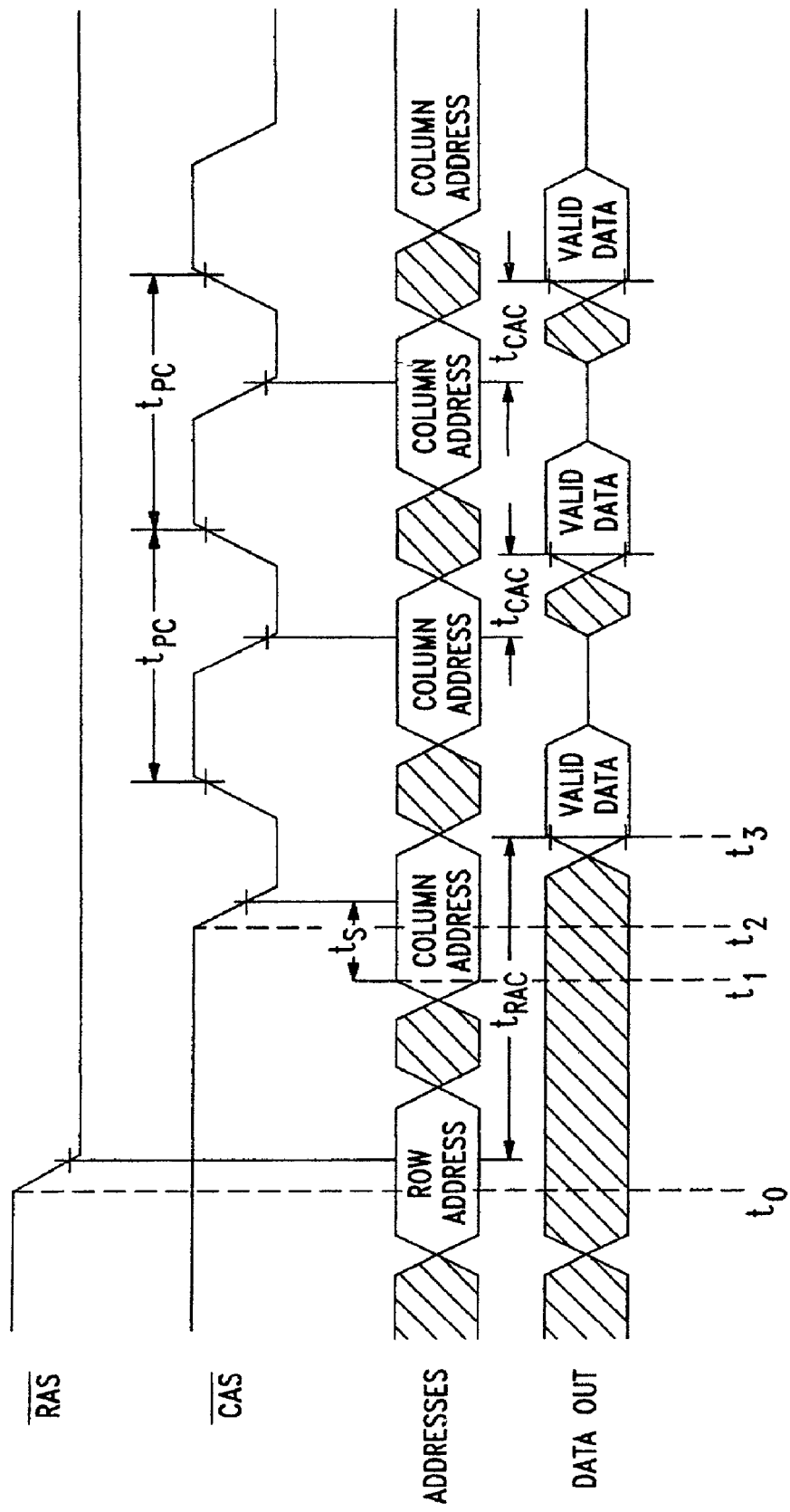
FIG. 1 is a timing diagram of a conventional fast-page-mode read cycle.

Consequently, such a page-mode read cycle is faster than the fast-page-mode cycle of FIG. 1, and is at least as fast, but less restrictive, than the nibble-mode cycle of FIG. 2. Because the multiplexer 22 couples the internal column address, not the external column address, to the column decoder 38, $t_{ipc}$ is shorter than $t_{pc}$. Therefore, the memory 26 can execute the page-mode read cycle of FIG. 1 faster than it can execute the fast-page-mode read cycle of FIG. 2. For the same reason, $t_{ipc}$ is often approximately the same as $t_{nc}$ of FIG. 2. Furthermore, if the system reads more than four columns of data from the row, the memory 26 can execute the page-mode read cycle of FIG. 3 faster than it can execute the nibble-mode read cycle of FIG. 2 because the memory need only load one external column address or index address to execute the cycle of FIG. 3.

Although an embodiment of the page-mode read cycle of FIG. 3 discussed, one can design the memory 26 to implement a page-mode write cycle in a similar fashion. Furthermore, although the cycle is discussed in terms of reading multiple columns within a row, one can design the memory 26 to allow the reading of multiple rows within a column. Moreover, instead of generating the internal column address, the column-address anticipation counter 14 may generate an index that an adder (not shown) adds to a base address (COL 0 in the above example) to generate the column address.

Still referring to FIGS. 3-5, other embodiments of the page-mode read cycle of FIG. 3 are envisioned.

In one embodiment, the page-mode read cycle is as described above except that the comparator 18 compares the external column address to the contents of the page length register/counter 16. The system loads the ending column, here COL 3, into the length register/counter 16 before commencing the read cycle. Next, the system loads the initial column address COL 0 into the column address anticipation counter 14, and the cycle proceeds as discussed above, except that the comparator 18 compares the external column address to the contents of the register/counter 16 instead of to the internal column address. As long as the external column address does not equal COL 3, the control circuit 24 determines that the page-mode cycle is still active. But when the external column address equals COL 3, the control circuit 24-terminates the page-mode read cycle. Therefore, the control circuit 24 disables the data-out buffer 34 and/or the counter 14, and the memory 26 awaits the next system command. Although in this embodiment the memory 26 would not output data stored in the ending column, here COL 3, one can modify the memory 26 so that it would output data from the ending column.

In a similar embodiment, the comparator 18 compares the internal column address from the column-address anticipation counter 14 to the cycle-ending address stored in the length register/counter 16.

In yet another embodiment, the length register/counter 16 functions as a counter, and the control circuit 24 terminates the page-mode cycle when the count reaches a predetermined value. The system loads the register/counter 16 with the number, here three, of columns to be read (COL 0-COL 2) on the first assertion of $\overline{CAS}$. The register/counter 16 then decrements the number by one in response to each subsequent assertion of $\overline{CAS}$. When the contents of the register/counter 16 equals zero (or some other predetermined end value), the control circuit 24 terminates the page-mode read cycle. Although described as decrementing the number of columns, the register/counter 16 can start from zero or another predetermined starting value and increment the number. When the number equals an ending number that the system has programmed into the control circuit 24 or into another block of the memory 26, the circuit 24 terminates the page-mode read cycle.

FIG. 6 is a block diagram of an electronic system 60, such as a computer system, that incorporates the memory circuit 26 of FIG. 5 according to an embodiment of the invention. The system 60 includes computer circuitry 62 for performing computer functions, such as executing software to perform desired calculations and tasks. The circuitry 62 typically includes a processor 64 and the memory circuit 26, which is coupled to the processor 64. One or more input devices 66, such as a keyboard or a mouse, are coupled to the computer circuitry 62 and allow an operator (not shown) to manually input data thereto. One or more output devices 68 are coupled to the computer circuitry 62 to provide to the operator data generated by the computer circuitry 62. Examples of such output devices 68 include a printer and a video display unit. One or more data-storage devices 70 are coupled to the computer circuitry 62 to store data on or retrieve data from external storage media (not shown). Examples of the storage devices 70 and the corresponding storage media include drives that accept hard and floppy disks, tape cassettes, and compact disk read-only memories (CD-ROMs). Typically, the computer circuitry 62 includes the address, data, and control buses that are coupled to the memory circuit 26.

What is claimed:

1. A memory, comprising:
an address bus operable to receive an external address during a data-transfer cycle;
an address counter operable to generate an internal address during the data-transfer cycle;
an address decoder coupled to the address counter;
a comparator coupled to the address bus and operable to compare the external address to a value; and
a control circuit coupled to the comparator and operable to terminate the data-transfer cycle based on the relationship between the external address and the value.

2. The memory of claim 1 wherein:
the address bus is operable to receive an external column address; and
the address counter is operable to generate an internal column address.

3. The memory of claim 1 wherein:
the address bus is operable to receive an initial external address and a subsequent external address; and
the address counter is operable to store the initial external address and to generate the internal address by varying the stored initial external address.

4. The memory of claim 1 wherein:
the address bus is operable to receive an initial external address and a subsequent external address; and
the address counter is operable to store the initial external address, to generate an initial internal address equal to the stored initial external address, and to generate a subsequent internal address by varying the stored initial external address.

5. The memory of claim 1 wherein:
the address bus is operable to receive an initial external address and a subsequent external address; and
the address counter is operable to store the initial external address, to generate an initial internal address equal to the stored initial external address, and to generate a subsequent internal address equal to the subsequent external address by varying the stored initial external address.

6. The memory of claim 1, further comprising:
a data buffer;
wherein the comparator is coupled to the address counter and is operable to compare the external address to the internal address; and
wherein the control circuit is coupled to the data buffer and is operable to enable the data buffer if the external address equals the internal address and to disable the data buffer if the external address does not equal the internal address.

7. The memory of claim 1, further comprising:
a data buffer;
a storage circuit operable to store a predetermined address;
wherein the comparator is coupled to the storage circuit and is operable to compare the external address to the predetermined address; and
wherein the control circuit is coupled to the data buffer and is operable to enable the data buffer if the external address does not equal the predetermined address and to disable the data buffer if the external address equals the predetermined address.

8. The memory of claim 1, further comprising:
a data buffer;
wherein the comparator is coupled to the address counter and is operable to compare the external address to the internal address; and
wherein the control circuit is coupled to the data buffer and the address counter and is operable to enable the counter if the external address equals the internal address and to disable the counter if the external address does not equal the internal address.

9. The memory of claim 1, further comprising:
a data buffer;

a storage circuit operable to store a predetermined address;
wherein the comparator is coupled to the storage circuit and is operable to compare the external address to the predetermined address; and
wherein the control circuit is coupled to the data buffer and the address counter and is operable to enable the counter if the external address does not equal the predetermined address and to disable the counter if the external address equals the predetermined address.

10. The memory of claim 1 wherein the data-transfer cycle comprises a read cycle.

11. A memory, comprising:
a data buffer operable to receive and hold data during a data-transfer cycle;
an address counter operable to generate an internal address during the data-transfer cycle;
a programmable storage circuit operable to store an address value during the data-transfer cycle;
a comparator coupled to the address counter and the storage circuit and operable to compare the internal address to the address value; and
a control circuit coupled to the storage circuit, the comparator, and the data buffer and operable to terminate the data-transfer cycle when the internal address has a predetermined relationship to the address value.

12. The memory of claim 11 wherein the control circuit is operable to disable the address counter in response to the value.

13. The memory of claim 11 wherein the control circuit is operable to disable the data buffer in response to the value.

14. The memory of claim 11 wherein:
the programmable storage circuit comprises a programmable counter operable to generate a count by incrementing or decrementing the stored value during the data-transfer cycle; and
wherein the control circuit is operable to terminate the data-transfer cycle when the count equals a predetermined value.

15. The memory of claim 11 wherein the address counter is operable to generate an internal column address.

16. The memory of claim 11 wherein the address counter is operable to store an initial internal address and to generate a subsequent internal address by incrementing or decrementing the stored initial internal address.

17. An electronic system, comprising:
a data input device;
a data output device; and
a computer circuit coupled to the data input and output devices and including a processor and a memory circuit coupled to the processor, the memory circuit including,
an address bus operable to receive an external address from the processor during a data transfer between the processor and the memory,
an address counter operable to generate an internal address during the data transfer,
an address decoder coupled to the address counter,
a comparator coupled to the address bus and the address decoder and operable to compare the external address to the internal address, and
a control circuit coupled to the comparator and operable to enable the data transfer if the external address equals the internal address and to disable the data transfer if the external address does not equal the internal address.

18. An electronic system, comprising:
a data input device;
a data output device; and
a computer circuit coupled to the data input and output devices and including a processor and a memory circuit coupled to the processor, the memory circuit including,
an address counter operable to generate an internal address during a data-transfer cycle between the processor and the memory;
a storage circuit operable to receive and store an address value from the processor before or during the data-transfer cycle;
a comparator coupled to the address counter and the storage circuit and operable to compare the internal address to the address value; and
a control circuit coupled to the storage circuit and the comparator and operable to terminate the data-transfer cycle when the internal address has a predetermined relationship to the address value.

19. The electronic system of claim 18 wherein:
the storage circuit comprises a programmable counter operable to generate a count by incrementing or decrementing the stored value during the data-transfer cycle; and
wherein the control circuit is operable to terminate the data-transfer when the count equals a predetermined value.

20. A method, comprising:
receiving an address strobe at a first node of a first portion of a memory circuit;
receiving a first address at a second node of the first portion of the memory circuit during a data-transfer cycle;
generating a second address within the first portion of the memory circuit during the data-transfer cycle;
comparing the first address to the second address within the first portion of the memory circuit; and
terminating the data-transfer cycle during which data is being transferred to or from a storage location residing at the second address if the first address does not have a predetermined relationship to the second address.

21. The method of claim 20, further comprising enabling the cycle if the first address has the predetermined relationship to the second address.

22. The method of claim 20 wherein:
receiving a first address comprises receiving at the second node of the first portion of the memory circuit a first address that is generated outside of the first portion of the memory circuit; and
generating a second address comprises generating a second address inside of the first portion of the memory circuit.

23. The method of claim 20, further comprising:
wherein terminating the cycle comprises terminating the cycle if the address does not equal the second address; and
enabling the cycle if the first address equals the second address.

24. A method, comprising:
loading a memory circuit with a predetermined value;
receiving a first address at a first node of the memory circuit during a data-transfer cycle, the first address generated from a source external to the memory circuit;
comparing the first address to the predetermined value within the memory circuit; and
terminating the data-transfer cycle during which data is being transferred to or from a storage location residing at the first address if the first address has a predetermined relationship to the predetermined value.

25. The method of claim 24, further comprising enabling the cycle if the first address does not have the predetermined relationship to the predetermined value.

26. The method of claim 24, further comprising:
wherein disabling the cycle comprises disabling the cycle if the first address equals the predetermined value; and
enabling the cycle if the first address does not equal the predetermined value.

27. The method of claim 24, further comprising:
receiving at a second node of the memory circuit a second address from outside of the memory circuit.

28. The method of claim 24, wherein the memory circuit includes the storage location.

29. A method, comprising:
loading a memory with a count value from an external source;
generating a first address inside of the memory, the first address being distinct from the count value;
incrementing or decrementing the count value;
comparing the count value to a predetermined value; and
terminating a cycle during which data is being transferred to or from a storage location residing at the first address if the count value has a predetermined relationship to the predetermined value.

30. The method of claim 29, further comprising enabling the cycle if the first address does not have the predetermined relationship to the predetermined value.

31. The method of claim 29, further comprising:
wherein terminating the cycle comprises terminating the cycle if the count value equals the predetermined value; and
enabling the cycle if the count value does not equal the predetermined value.

32. The method of claim 29, further comprising receiving with the memory a second address from outside of the memory while generating the first address.

33. A memory, comprising:
an address bus operable to receive an external address during a data-transfer cycle;
an address counter operable to generate an internal address during the data-transfer cycle;
an address decoder coupled to the address counter;
a comparator coupled to the address bus and to the address counter and operable to compare the external address to the internal address;
a control circuit coupled to the comparator and operable to enable a data transfer based on the relationship between the external address and the internal address.

34. A memory, comprising:
a data buffer operable to receive and hold data during a data-transfer cycle;
an address counter operable to generate an internal address during the data-transfer cycle;
a programmable storage circuit operable to store a value during the data-transfer cycle; and
a control circuit coupled to the storage circuit and the data buffer and operable to terminate the data-transfer cycle in response to the value.

35. An electronic system, comprising:
a data input device;
a data output device; and
a computer circuit coupled to the data input and output devices and including a processor and a memory circuit coupled to the processor, the memory circuit including,
an address counter operable to generate an internal address during a data-transfer cycle between the processor and the memory;
a storage circuit operable to receive and store a value from the processor before or during the data-transfer cycle; and
a control circuit coupled to the storage circuit and operable to terminate the data-transfer cycle in response to the stored value.

* * * * *

UNITED STATES PATENT AND TRADEMARK OFFICE
CERTIFICATE OF CORRECTION

| | | |
|---|---|---|
| PATENT NO. | : 7,290,117 B2 | |
| APPLICATION NO. | : 10/032109 | |
| DATED | : October 30, 2007 | |
| INVENTOR(S) | : Erik E. Erlandson et al. | |

It is certified that error appears in the above-identified patent and that said Letters Patent is hereby corrected as shown below:

On sheet 4 of 6, in Fig. 4, line 3, delete "VALVE" and insert -- VALUE --, therefor.

Signed and Sealed this

Twenty-fourth Day of June, 2008

JON W. DUDAS
*Director of the United States Patent and Trademark Office*